(12) United States Patent
Ono et al.

(10) Patent No.: US 7,936,051 B2
(45) Date of Patent: May 3, 2011

(54) SILICON WAFER AND ITS MANUFACTURING METHOD

(75) Inventors: Toshiaki Ono, Tokyo (JP); Masataka Hourai, Tokyo (JP)

(73) Assignee: Sumco Corporation, Tokyo (JP)

( * ) Notice: Subject to any disclaimer, the term of this patent is extended or adjusted under 35 U.S.C. 154(b) by 546 days.

(21) Appl. No.: 12/025,261

(22) Filed: Feb. 4, 2008

(65) Prior Publication Data
US 2008/0197457 A1    Aug. 21, 2008

(30) Foreign Application Priority Data

Feb. 16, 2007    (JP) ................. 2007-036630

(51) Int. Cl.
*H01L 21/02*    (2006.01)
(52) U.S. Cl. ............... 257/655; 257/620; 257/E21.122; 257/E21.077; 438/502; 438/522; 438/530; 438/633
(58) Field of Classification Search ........................ None
See application file for complete search history.

(56) References Cited

U.S. PATENT DOCUMENTS

2005/0229842 A1 * 10/2005 Umeno et al. ................. 117/84
2006/0291832 A1    12/2006 Ito

FOREIGN PATENT DOCUMENTS

| JP | 2003-055088 | | 2/2003 |
|---|---|---|---|
| JP | 2003-059932 | | 2/2003 |
| JP | 2006-310690 | A | 11/2006 |
| JP | 2008166517 | A * | 7/2008 |
| KR | 1019990077707 | | 10/1999 |

OTHER PUBLICATIONS

English Language Abstract of JP 2006-310690 A.
U.S. Appl. No. 12/035,588 to Toshiaki Ono et al., filed Feb. 22, 2008, entitled "Soi Wafer and Manufacturing Method Thereof".
Korean Office Action dated Mar. 25, 2010 that issued with respect to patent family member Korean Patent Application No. 10-2008-0013377, along with a partial English language translation.

* cited by examiner

*Primary Examiner* — Evan Pert
*Assistant Examiner* — Scott Wilson
(74) *Attorney, Agent, or Firm* — Greenblum & Bernstein, PLC

(57) ABSTRACT

A silicon wafer which achieves a gettering effect without occurrence of slip dislocations is provided, and the silicon wafer is subject to heat treatment after slicing from a silicon monocrystal ingot so that a layer which has zero light scattering defects according to the 90° light scattering method is formed in a region at a depth from the wafer surface of 25 μm or more but less than 100 μm, and a layer which has a light scattering defect density of $1 \times 10^8/cm^3$ or more according to the 90° light scattering method is formed in a region at a depth of 100 μm from the wafer surface.

4 Claims, 2 Drawing Sheets

SILICON WAFER AND ITS MANUFACTURING METHOD

BACKGROUND OF THE INVENTION

1. Field of the Invention

The present invention relates to a silicon wafer suited for use in a semiconductor device manufacturing process which conducts heat treatment at a maximum temperature of 1100° C. or more and at a rate of temperature increase of 300° C./sec or more after the silicon wafer which is the base material of the device has undergone a mirror machining process, and to a manufacturing method thereof.

Priority is claimed on Japanese Patent Application No. 2007-036630, filed Feb. 16, 2007, the content of which is incorporated herein by reference.

2. Description of Related Art

Due to the ever higher integration of devices, furnaces exhibiting rapid temperature increases and decreases have come into frequent use in device manufacturing processes (see Patent Reference 1), and their maximum temperatures are also trending upward. In particular, in the case of unilateral heating inside furnaces exhibiting rapid temperature increases and decreases, it happens—although for a very short time—that a large temperature disparity occurs between the front face and rear face of the wafer.

When a large temperature disparity occurs between the front and rear faces in this manner even for a short time, it has been found that slip dislocations may occur from the oxygen precipitate existing in the vicinity of surface layer of the wafer, which may move to the surface layer of the wafer (the active layer side of the device), and penetrate the surface.

Moreover, when punch-out dislocations which arise from oxygen precipitate before heat treatment involving rapid temperature increase/decrease and when dislocation clusters which are aggregates of interstitial silicon exist in the wafer, high stress is sustained, slip dislocations occur, and the surface layer of the wafer is penetrated. When such dislocations exist in the active layer of the device, they cause leak defects in the device, and degrade device yield.

Patent Reference 1: Japanese Unexamined Patent Application, First Publication No. 2006-310690

SUMMARY OF THE INVENTION

The problem that the present invention is to solve is to provide a silicon wafer which achieves a gettering effect without occurrence of slip dislocations even when heat treatment is conducted at a maximum temperature of 1100° C. or more and at a rate of temperature increase of 300° C./sec or more after the silicon wafer has undergone a mirror machining process.

With respect to the first aspect of the present invention, after slicing from a silicon monocrystal ingot, heat treatment is conducted so that a layer which has zero light scattering defects according to the 90° light scattering method is formed in a region at a depth from the wafer surface of 25 μm or more but less than 100 μm, and a layer which has a light scattering defect density of $1 \times 10^8/cm^3$ or more according to the 90° light scattering method is formed in a region at a depth of 100 μm from the wafer surface.

The second aspect of the present invention pertains to a silicon wafer sliced from a silicon monocrystal ingot grown by the Czochralski technique so as to be free of grown-in defects in the body portion, which is a silicon wafer used in a semiconductor device manufacturing process which conducts heat treatment under conditions of a maximum temperature of 1100° C. or more and a rate of temperature increase of 300° C./sec or more after subjecting the silicon wafer to mirror machining, wherein a layer which has a light scattering defect density of $2 \times 15$ cm$^3$ or less according to the 90° light scattering method is formed in a region at a depth of 50 μm or more from the wafer surface.

According to the first aspect of the present invention, as a layer which has zero light scattering defects according to the 90° light scattering method is formed in a region at a depth from the wafer surface (active layer side of the device) of 25 μm or more but less than 100 μm, slip dislocations do not occur even when heat treatment is conducted at a maximum temperature of 1100° C. or more and at a rate of temperature increase of 300° C./sec or more after the silicon wafer has undergone a mirror machining process.

In addition, as a layer which has a light scattering defect density of $1 \times 10^8/cm^3$ or more according to the 90° light scattering method is formed in a region at a depth of 100 μm from the wafer surface, a gettering effect relative to heavy metal contaminants is obtained.

According to the second aspect of the present invention, as a layer which has a light scattering defect density of $2 \times 10^5$ cm$^3$ or less according to the 90° light scattering method is formed in a region at a depth of 50 μm or more from the wafer surface, slip dislocations do not occur even when heat treatment is conducted at a maximum temperature of 1100° C. or more and at a rate of temperature increase of 300° C./sec or more after the silicon wafer has undergone a mirror machining process.

Figure 1:
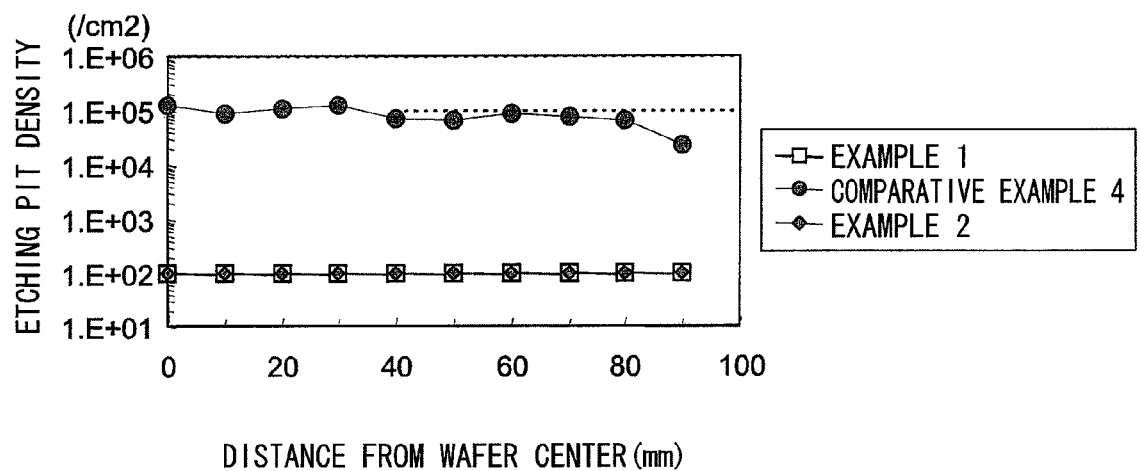
FIG. 1 is a graph which shows results confirming a gettering effect by the present invention.

DETAILED DESCRIPTION OF THE INVENTION (1) The Invention According to the First Aspect When a wafer which has been sliced from a silicon monocrystal ingot is subjected to heat treatment so that a layer which has zero light scattering defects according to the 90° light scattering method is formed in a region at a depth from the wafer surface of 25 μm or more but less than 100 μm, and a layer which has a light scattering defect density of $1 \times 10^8/cm^3$ or more according to the 90° light scattering method is formed in a region at a depth of 100 μm from the wafer surface, it was confirmed in conjunction with comparative examples and reference examples that slip dislocations do not occur and that a gettering effect is obtained with such heat treated wafers even when they are subjected to heat treatment under conditions of a maximum temperature of 1100° C. or more and a rate of temperature increase of 300° C./sec or more in a semiconductor device manufacturing process.

In order to distinguish between the heat treatment conducted in the semiconductor device manufacturing process and the heat treatment conducted in the silicon wafer manufacturing process, the heat treatment conducted in the semiconductor device manufacturing process is specifically referred to as rapid-temperature-increase/decrease heat treatment in the following description.

EXAMPLE 1

A silicon wafer (with an initial oxygen concentration of 10.8-11.9×10$^{17}$ atoms/cc (old-ASTM)) sliced from a silicon monocrystal ingot with a diameter of 200 mm was subjected to heat treatment in a non-oxidizing atmosphere under conditions of a heat treatment temperature of 1200° C., a heat treatment time of 2 hours, a rate of temperature increase of 7.5° C./min within a temperature range of 700° C.-1000° C., and a rate of temperature increase of 1° C./min within a temperature range of 1000° C.-1200° C. during the heat treatment process.

This post-heat treatment silicon wafer (hereinafter referred to as the silicon wafer of example 1) was observed by transmission electron microscope, and it was confirmed whether or not punch-out dislocations from bulk micro defects (BMD) had occurred. As shown in Table 1, the occurrence of punch-out dislocations was not observed.

Moreover, completeness in the vicinity of the surface layer of the post-heat treatment silicon wafer was evaluated by the 90° light scattering method using MO-441 manufactured by Mitsui Kinzoku Co. Ltd. Measurement of light scattering defects (light scattering bodies) by this 90° light scattering method was conducted by the incidence of light of 1.06 μm (near infrared) wavelength of 100 mW output from the surface side of the silicon wafer, and the detection of 90° scattered light detected from the cleaved surface of the wafer. The 90° scattered light was attenuated by insertion of a filter.

The measurement region was considered as the region to a depth of 260 μm from the wafer surface, and 10 points were measured in the radial direction of the wafer with 2 mm in the diametric direction of the wafer constituting 1 view field. Based on the photographed images, measurement proceeded at the depth from the wafer surface where light scattering defects are first detected, and the depth where light scattering defects are not detected was sought. In addition, the density of light scattering defects at a depth of 100 μm was also measured.

As a result, as shown in Table 1, it was found with respect to the wafer of example 1 that the region where light scattering defects are zero was the region at 51 μm from the wafer surface. Moreover, light scattering defect density at a depth of 100 μm from the wafer surface was 1.3×10$^8$/cm$^3$.

Next, this silicon wafer of example 1 was repeatedly subjected 3 times to the rapid-temperature-increase/decrease heat treatment conducted in device manufacturing processes under conditions of a maximum temperature of 1150° C. and a rate of temperature increase of 300° C./sec. It was subsequently observed by X-ray topography observation whether there existed slip dislocations with movement toward the wafer surface, but the occurrence of slip dislocations was not observed.

In addition, Ni contamination of 1×10$^{13}$ atoms/cm$^2$ was conducted relative to the surface of the aforementioned silicon wafer of example 1, and after conducting heat treatment of 900° C.×30 min in a furnace with a nitrogen atmosphere, light etching was conducted for 2 minutes, and etching pits (etching pit density) that had arisen on the wafer surface were measured. These etching pits are Ni silicide which arises on the wafer surface in the case where the gettering effect is insufficient. The results are shown by the □ marks in FIG. 1.

EXAMPLE 2

A silicon wafer (with an initial oxygen concentration of 12.1-13.2×10$^{17}$ atoms/cc (old-ASTM)) sliced from a silicon monocrystal ingot with a diameter of 200 mm was subjected to heat treatment in a non-oxidizing atmosphere under conditions of a heat treatment temperature of 1200° C., a heat treatment time of 2 hours, a rate of temperature increase of 7.5° C./min within a temperature range of 700° C.-1000° C., and a rate of temperature increase of 1° C./min within a temperature range of 1000° C.-1200° C. during the heat treatment process.

This post-heat treatment silicon wafer (hereinafter referred to as the silicon wafer of example 2) was observed by transmission electron microscope, and it was confirmed whether or not punch-out dislocations from bulk micro defects (BMD) had occurred. As shown in Table 1, the occurrence of punch-out dislocations was not observed.

Moreover, when completeness in the vicinity of the surface layer of the post-heat treatment silicon wafer was evaluated by the 90° light scattering method using MO-441 manufactured by Mitsui Kinzoku Co. Ltd. in the same manner as example 1, it was found, as shown in Table 1, that the region where light scattering defects are zero was the region at 25 μm from the wafer surface. Light scattering defect density at a depth of 100 μm from the wafer surface was 2.7×10$^9$/cm$^3$.

Next, this silicon wafer of example 2 was repeatedly subjected 3 times to the rapid-temperature-increase/decrease heat treatment conducted in device manufacturing processes under conditions of a maximum temperature of 1150° C. and a rate of temperature increase of 300° C./sec. It was subsequently observed by X-ray topography observation whether there existed slip dislocations with movement toward the wafer surface, but the occurrence of slip dislocations was not observed.

In addition, as in example 1, Ni contamination of 1×10$^{13}$ atoms/cm$^2$ was conducted relative to the surface of the aforementioned silicon wafer of example 2, and after conducting heat treatment of 900° C.×30 min in a furnace with a nitrogen atmosphere, light etching was conducted for 2 minutes, and etching pits (etching pit density) that had arisen on the wafer surface were measured. The results are shown by the ◊ marks in FIG. 1.

EXAMPLE 7

A silicon wafer (with an initial oxygen concentration of 12.1-13.2×10$^{17}$ atoms/cc (old-ASTM)) sliced from a silicon monocrystal ingot with a diameter of 200 mm was subjected to heat treatment in a non-oxidizing atmosphere under conditions of a heat treatment temperature of 1200° C., a heat treatment time of 2 hours, a rate of temperature increase of 7.5° C./min within a temperature range of 700° C.-1000° C., and a rate of temperature increase of 1° C./min within a temperature range of 1000° C.-1200° C. during the heat treatment process.

This post-heat treatment silicon wafer (hereinafter referred to as the silicon wafer of example 7) was observed by transmission electron microscope, and it was confirmed whether or not punch-out dislocations from bulk micro defects (BMD) had occurred. As shown in Table 1, the occurrence of punch-out dislocations was not observed.

Moreover, when completeness in the vicinity of the surface layer of the post-heat treatment silicon wafer was evaluated by the 90° light scattering method using MO-441 manufactured by Mitsui Kinzoku Co. Ltd. in the same manner as example 1, it was found, as shown in Table 1, that the region where light scattering defects are zero was the region at 25 μm from the wafer surface. Light scattering defect density at a depth of 100 μm from the wafer surface was 2.7×10$^9$/cm$^3$.

Next, this silicon wafer of example 7 was repeatedly subjected 3 times to the rapid-temperature-increase/decrease heat treatment (flash-lamp annealing) conducted in device manufacturing processes under conditions of a maximum temperature of 1200° C. and a rate of temperature increase of 250000° C./sec. It was subsequently observed by X-ray topography observation whether there existed slip dislocations with movement toward the wafer surface, but the occurrence of slip dislocations was not observed.

COMPARATIVE EXAMPLE 1

As a comparative example of examples 1 and 2, a silicon wafer (with an initial oxygen concentration of 12.1-13.2×$10^{17}$ atoms/cc (old-ASTM)) sliced from a silicon monocrystal ingot with a diameter of 200 mm was subjected to heat treatment in a non-oxidizing atmosphere under conditions of a heat treatment temperature of 1200° C., a heat treatment time of 1 hour, a rate of temperature increase of 7.5° C./min within a temperature range of 700° C.-1000° C., and a rate of temperature increase of 1° C./min within a temperature range of 1000° C.-1200° C. during the heat treatment process.

This post-heat treatment silicon wafer (hereinafter referred to as the silicon wafer of comparative example 1) was observed by transmission electron microscope, and it was confirmed whether or not punch-out dislocations from bulk micro defects (BMD) had occurred. As shown in Table 1, the occurrence of punch-out dislocations was not observed.

Moreover, when completeness in the vicinity of the surface layer of the post-heat treatment silicon wafer was evaluated by the 90° light scattering method using MO-441 manufactured by Mitsui Kinzoku Co. Ltd. in the same manner as embodiment 1, it was found, as shown in Table 1, that the region where light scattering defects are zero was the region at 19 µm from the wafer surface. Light scattering defect density at a depth of 100 µm from the wafer surface was 1.3×$10^9$/cm$^3$.

Next, this silicon wafer of comparative example 1 was repeatedly subjected 3 times to the rapid-temperature-increase/decrease heat treatment conducted in device manufacturing processes under conditions of a maximum temperature of 1150° C. and a rate of temperature increase of 300° C./sec. When it was subsequently observed by X-ray topography observation whether there existed slip dislocations with movement toward the wafer surface, the occurrence of slip dislocations was observed.

COMPARATIVE EXAMPLE 2

As a comparative example of examples 1 and 2, a silicon wafer (with an initial oxygen concentration of 12.1-13.2×$10^{17}$ atoms/cc (old-ASTM)) sliced from a silicon monocrystal ingot with a diameter of 200 mm was subjected to heat treatment in a non-oxidizing atmosphere under conditions of a heat treatment temperature of 1200° C., a heat treatment time of 0.5 hour, a rate of temperature increase of 7.5° C./min within a temperature range of 700° C.-1000° C., and a rate of temperature increase of 1° C./min within a temperature range of 1000° C.-1200° C. during the heat treatment process.

This post-heat treatment silicon wafer (hereinafter referred to as the silicon wafer of comparative example 2) was observed by transmission electron microscope, and it was confirmed whether or not punch-out dislocations from bulk micro defects (BMD) had occurred. As shown in Table 1, the occurrence of punch-out dislocations was not observed.

Moreover, when completeness in the vicinity of the surface layer of the post-heat treatment silicon wafer was evaluated by the 90° light scattering method using MO-441 manufactured by Mitsui Kinzoku Co. Ltd. in the same manner as example 1, it was found, as shown in Table 1, that the region where light scattering defects are zero was the region at 9 µm from the wafer surface. Light scattering defect density at a depth of 100 µm from the wafer surface was 5.7×$10^8$/cm$^3$.

Next, this silicon wafer of comparative example 2 was repeatedly subjected 3 times to the rapid-temperature-increase/decrease heat treatment conducted in device manufacturing processes under conditions of a maximum temperature of 1150° C. and a rate of temperature increase of 300° C./sec. When it was subsequently observed by X-ray topography observation whether there existed slip dislocations with movement toward the wafer surface, the occurrence of slip dislocations was observed.

COMPARATIVE EXAMPLE 3

As a comparative example of examples 1 and 2, a silicon wafer (with an initial oxygen concentration of 12.1-13.2×$10^{17}$ atoms/cc (old-ASTM)) sliced from a silicon monocrystal ingot with a diameter of 200 mm was subjected to heat treatment in a non-oxygenated atmosphere under conditions of a heat treatment temperature of 1200° C., a heat treatment time of 1 hour, a rate of temperature increase of 7.5° C./min within a temperature range of 700° C.-1000° C., and a rate of temperature increase of 1° C./min within a temperature range of 1000° C.-1200° C. during the heat treatment process.

This post-heat treatment silicon wafer (hereinafter referred to as the silicon wafer of comparative example 3) was observed by transmission electron microscope, and it was confirmed whether or not punch-out dislocations from bulk micro defects (BMD) had occurred. As shown in Table 1, the occurrence of punch-out dislocations was not observed.

Moreover, when completeness in the vicinity of the surface layer of the post-heat treatment silicon wafer was evaluated by the 90° light scattering method using MO-441 manufactured by Mitsui Kinzoku Co. Ltd. in the same manner as example 1, it was found, as shown in Table 1, that the region where light scattering defects are zero was the region at 16 µm from the wafer surface. Light scattering defect density at a depth of 100 µm from the wafer surface was 2.2×$10^9$/cm$^3$.

Next, this silicon wafer of comparative example 3 was repeatedly subjected 3 times to the rapid-temperature-increase/decrease heat treatment conducted in device manufacturing processes under conditions of a maximum temperature of 1100° C. and a rate of temperature increase of 300° C./sec. When it was subsequently observed by X-ray topography observation whether there existed slip dislocations with movement toward the wafer surface, the occurrence of slip dislocations was observed.

COMPARATIVE EXAMPLE 4

As a comparative example of examples 1 and 2, a silicon wafer (with an initial oxygen concentration of 9.6-10.3×$10^{17}$ atoms/cc (old-ASTM)) sliced from a silicon monocrystal ingot with a diameter of 200 mm was subjected to heat treatment in a non-oxidizing atmosphere under conditions of a heat treatment temperature of 1200° C., a heat treatment time of 2 hours, a rate of temperature increase of 7.5° C./min within a temperature range of 700° C.-1000° C., and a rate of temperature increase of 1° C./min within a temperature range of 1000° C.-1200° C. during the heat treatment process.

This post-heat treatment silicon wafer (hereinafter referred to as the silicon wafer of comparative example 4) was observed by transmission electron microscope, and it was confirmed whether or not punch-out dislocations from bulk micro defects (BMD) had occurred. As shown in Table 1, the occurrence of punch-out dislocations was not observed.

Moreover, when completeness in the vicinity of the surface layer of the post-heat treatment silicon wafer was evaluated by the 90° light scattering method using MO-441 manufactured by Mitsui Kinzoku Co. Ltd. in the same manner as example 1, it was found, as shown in Table 1, that the region where light scattering defects are zero was the region at 91 μm from the wafer surface. Light scattering defect density at a depth of 100 μm from the wafer surface was $2.7 \times 10^7/cm^3$.

Next, this silicon wafer of comparative example 4 was repeatedly subjected 3 times to the rapid-temperature-increase/decrease heat treatment conducted in device manufacturing processes under conditions of a maximum temperature of 1150° C. and a rate of temperature increase of 300° C./sec. When it was subsequently observed by X-ray topography observation whether there existed slip dislocations with movement toward the wafer surface, the occurrence of slip dislocations was not observed.

In addition, as in example 1, Ni contamination of $1 \times 10^{13}$ atoms/cm² was conducted relative to the surface of the aforementioned silicon wafer of comparative example 4, and after conducting heat treatment of 900° C.×30 min in a furnace with a nitrogen atmosphere, light etching was conducted for 2 minutes, and etching pits (etching pit density) that had arisen on the wafer surface were measured. The results are shown by the O marks in FIG. 1.

REFERENCE EXAMPLE 1

As a reference example of example 1 and 2 and comparative examples 1-4, a silicon wafer (with an initial oxygen concentration of $12.1-13.2 \times 10^{17}$ atoms/cc (old-ASTM)) sliced from a silicon monocrystal ingot with a diameter of 200 mm was subjected to heat treatment in a non-oxidizing atmosphere under conditions of a heat treatment temperature of 1200° C., a heat treatment time of 1 hour, a rate of temperature increase of 7.5° C./min within a temperature range of 700° C.-1000° C., and a rate of temperature increase of 1° C./min within a temperature range of 1000° C.-1200° C. during the heat treatment process.

This post-heat treatment silicon wafer (hereinafter referred to as the silicon wafer of reference example 1) was observed by transmission electron microscope, and it was confirmed whether or not punch-out dislocations from bulk micro defects (BMD) had occurred. As shown in Table 1, the occurrence of punch-out dislocations was not observed.

Moreover, when completeness in the vicinity of the surface layer of the post-heat treatment silicon wafer was evaluated by the 90° light scattering method using MO-441 manufactured by Mitsui Kinzoku Co. Ltd. in the same manner as example 1, it was found, as shown in Table 1, that the region where light scattering defects are zero was the region at 17 μm from the wafer surface. Light scattering defect density at a depth of 100 μm from the wafer surface was $1.9 \times 10^9/cm^3$.

Next, this silicon wafer of reference example 1 was repeatedly subjected 3 times to the rapid-temperature-increase/decrease heat treatment conducted in device manufacturing processes under conditions of a maximum temperature of 1075° C. and a rate of temperature increase of 300° C./sec. When it was subsequently observed by X-ray topography observation whether there existed slip dislocations with movement toward the wafer surface, the occurrence of slip dislocations was not observed.

REFERENCE EXAMPLE 2

As a reference example of examples 1 and 2 and comparative examples 1-4, a silicon wafer (with an initial oxygen concentration of $12.1-13.2 \times 10^{17}$ atoms/cc (old-ASTM)) sliced from a silicon monocrystal ingot with a diameter of 200 mm was subjected to heat treatment in a non-oxidizing atmosphere under conditions of a heat treatment temperature of 1200° C., a heat treatment time of 3 hours, a rate of temperature increase of 7.5° C./min within a temperature range of 700° C.-1000° C., and a rate of temperature increase of 1° C./min within a temperature range of 1000° C.-1200° C. during the heat treatment process.

This post-heat treatment silicon wafer (hereinafter referred to as the silicon wafer of reference example 2) was observed by transmission electron microscope, and it was confirmed whether or not punch-out dislocations from bulk micro defects (BMD) had occurred. As shown in Table 1, the occurrence of punch-out dislocations was observed.

Moreover, when completeness in the vicinity of the surface layer of the post-heat treatment silicon wafer was evaluated by the 90° light scattering method using MO-441 manufactured by Mitsui Kinzoku Co. Ltd. in the same manner as example 1, it was found, as shown in Table 1, that the region where light scattering defects are zero was the region at 30 μm from the wafer surface. Light scattering defect density at a depth of 100 μm from the wafer surface was $4.5 \times 10^9/cm^3$.

Next, this silicon wafer of reference example 2 was repeatedly subjected 3 times to the rapid-temperature-increase/decrease heat treatment conducted in device manufacturing processes under conditions of a maximum temperature of 1075° C. and a rate of temperature increase of 300° C./sec. When it was subsequently observed by X-ray topography observation whether there existed slip dislocations with movement toward the wafer surface, the occurrence of slip dislocations was not observed.

REFERENCE EXAMPLE 3

As a reference example of examples 1 and 2 and comparative examples 1-4, a silicon wafer (with an initial oxygen concentration of $12.1-13.2 \times 10^{17}$ atoms/cc (old-ASTM)) sliced from a silicon monocrystal ingot with a diameter of 200 mm was subjected to heat treatment in a non-oxidizing atmosphere under conditions of a heat treatment temperature of 1200° C., a heat treatment time of 1 hour, a rate of temperature increase of 7.5° C./min within a temperature range of 700° C.-1000° C., and a rate of temperature increase of 1° C./min within a temperature range of 1000° C.-1200° C. during the heat treatment process.

This post-heat treatment silicon wafer (hereinafter referred to as the silicon wafer of reference example 3) was observed by transmission electron microscope, and it was confirmed whether or not punch-out dislocations from bulk micro defect (BMD) had occurred. As shown in Table 1, the occurrence of punch-out dislocations was not observed.

Moreover, when completeness in the vicinity of the surface layer of the post-heat treatment silicon wafer was evaluated by the 90° light scattering method using MO-441 manufactured by Mitsui Kinzoku Co. Ltd. in the same manner as example 1, it was found, as shown in Table 1, that the region where light scattering defects are zero was the region at 17 μm from the wafer surface. Light scattering defect density at a depth of 100 μm from the wafer surface was $1.6 \times 10^9/cm^3$.

Next, this silicon wafer of reference example 3 was repeatedly subjected 3 times to the rapid-temperature-increase/decrease heat treatment conducted in device manufacturing processes under conditions of a maximum temperature of 1100° C. and a rate of temperature increase of 230° C./sec. When it was subsequently observed by X-ray topography observation whether there existed slip dislocations with movement toward the wafer surface, the occurrence of slip dislocations was not observed.

REFERENCE EXAMPLE 4

As a reference example of examples 1 and 2 and comparative examples 1-4, a silicon wafer (with an initial oxygen concentration of 12.1-13.2×10$^{17}$ atoms/cc (old-ASTM)) sliced from a silicon monocrystal ingot with a diameter of 200 mm was subjected to heat treatment in a non-oxidizing atmosphere under conditions of a heat treatment temperature of 1200° C., a heat treatment time of 1 hour, a rate of temperature increase of 7.5° C./min within a temperature range of 700° C.-1000° C., and a rate of temperature increase of 1° C./min within a temperature range of 1000° C.-1200° C. during the heat treatment process.

This post-heat treatment silicon wafer (hereinafter referred to as the silicon wafer of reference example 4) was observed by transmission electron microscope, and it was confirmed whether or not punch-out dislocations from bulk micro defects (BMD) had occurred. As shown in Table 1, the occurrence of punch-out dislocations was not observed.

Moreover, when completeness in the vicinity of the surface layer of the post-heat treatment silicon wafer was evaluated by the 90° light scattering method using MO-441 manufactured by Mitsui Kinzoku Co. Ltd. in the same manner as example 1, it was found, as shown in Table 1, that the region where light scattering defects are zero was the region at 19 μm from the wafer surface. Light scattering defect density at a depth of 100 μm from the wafer surface was 2.8×10$^9$/cm$^3$.

Next, this silicon wafer of reference example 4 was repeatedly subjected 3 times to the rapid-temperature-increase/decrease heat treatment conducted in device manufacturing processes under conditions of a maximum temperature of 1100° C. and a rate of temperature increase of 250° C./sec. When it was subsequently observed by X-ray topography observation whether there existed slip dislocations with movement toward the wafer surface, the occurrence of slip dislocations was not observed.

<<Consideration>>

From the results of comparative example 1 and reference examples 1-4, it was confirmed that when the conditions of the rapid-temperature-increase/decrease heat treatment conducted in device manufacturing processes are not those of a maximum temperature of 1100° C. or more and a rate of temperature increase of 300° C./sec or more, slip dislocations do not occur according to X-ray topography observation.

From the results of examples 1, 2 and 7 and comparative examples 1-4 which are based thereon, it was confirmed that if a layer which has zero light scattering defects according to the 90° light scattering method is formed in a region at a depth from the wafer surface of 25 μm or more but less than 100 μm, slip dislocations do not occur even when rapid-temperature-increase/decrease heat treatment is conducted under the aforementioned conditions of a maximum temperature of 1100° C. or more and a rate of temperature increase of 300° C./sec or more.

Moreover, from the results of examples 1, 2 and 7 and comparative example 4, it was confirmed that if a layer which has a light scattering defect density of 1×10$^8$/cm$^3$ or more according to the 90° light scattering method is formed in a region at a depth of 100 μm from the wafer surface, a satisfactory gettering effect is demonstrated by these light scattering defects.

(2) The Invention According to the Second Aspect

With respect to a silicon wafer sliced from a silicon monocrystal ingot grown by the Czochralski method so as to be free of grown-in defects in the body portion, if a layer which has a light scattering defect density of 2×10$^5$ cm$^3$ or less according to the 90° light scattering method is formed in a region at a depth of 50 μm or more from the wafer surface, it was confirmed in conjunction with comparative examples and reference examples that slip dislocations do not occur even when this wafer is subjected to heat treatment under conditions of a maximum temperature of 1100° C. or more and a

TABLE 1

| | Wafer properties | | Rapid heat treatment conditions | | Evaluation results | | |
|---|---|---|---|---|---|---|---|
| | Depth (μm) at which light scattering defects are zero | Light scattering defect density (/cm3) at a depth of 100 μm | Maximum temperature (° C.) | Rate of temperature increase (° C./sec) | Slip dislocations | Punch-out dislocations | Gettering effect |
| Example 1 | 51 | 1.3E+08 | 1150 | 300 | No | No | Sufficient |
| Example 2 | 25 | 2.7E+09 | 1150 | 300 | No | No | Sufficient |
| Example 7 | 25 | 2.7E+09 | 1200 | 250000 | No | No | — |
| Comparative example 1 | 19 | 1.3E+09 | 1150 | 300 | Yes | No | — |
| Comparative example 2 | 9 | 5.7E+08 | 1150 | 300 | Yes | No | — |
| Comparative example 3 | 16 | 2.2E+09 | 1100 | 300 | Yes | No | — |
| Comparative example 4 | 91 | 2.7E+07 | 1150 | 300 | No | No | Insufficient |
| Reference example 1 | 17 | 1.9E+09 | 1075 | 300 | No | No | — |
| Reference example 2 | 30 | 4.5E+09 | 1075 | 300 | No | Yes | — |
| Reference example 3 | 18 | 1.6E+09 | 1100 | 230 | No | No | — |
| Reference example 4 | 19 | 2.8E+09 | 1100 | 250 | No | No | — | rate of temperature increase of 300° C./sec or more in a semiconductor device manufacturing process.

Grown-in defects signify microdefects which become evident in the manufacturing process of the device and which greatly affect its performance; these are defects whose causes develop during the monocrystal growth phase.

The "silicon monocrystal ingot grown . . . so as to be free of grown-in defects in the body portion" pertaining to the present invention may be obtained, for example, by a silicon monocrystal growth method according to the Czochralski method, which is a growth method that conducts pulling up within a prescribed range of speed and that sets intracrystalline temperature distribution immediately after solidification during pulling up (temperature distribution in the pull direction; a distribution within a temperature range from the melting point to 1250° C.) so that the crystal periphery (Ge) is smaller than the crystal center (Gc) (Gc>Ge).

The pulling up speed of prescribed range that serves to obtain monocrystal free of grown-in defects varies according to the hot zone structure which satisfies the bore diameter of the monocrystal and a temperature distribution of Gc>Ge. However, if the monocrystal diameter and the pulling up apparatus remain the same, the speed range is constant. Consequently, it is acceptable to initially grow monocrystal with continual changing of pulling up speed, and to study and select the speed range based thereon.

EXAMPLE 3

Figure 2:
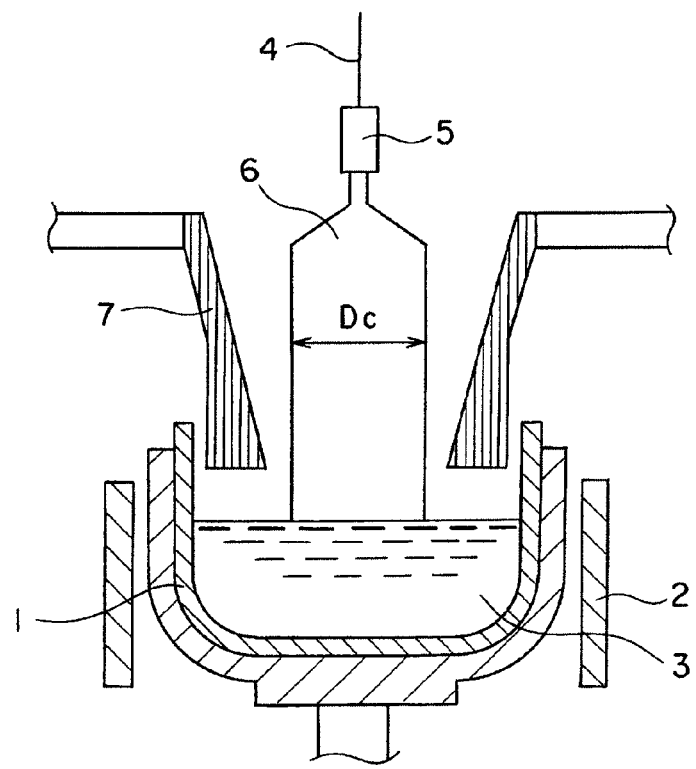
FIG. 2 is a schematic diagram which shows an example of configuration of a silicon monocrystal growth apparatus used in the examples.

Using an apparatus with the sectional structure which is schematically shown in FIG. 2, a growth experiment was conducted with respect to a silicon monocrystal 6. In this same drawing, a thermal shield 7 is structured so that its shell is made from graphite, and its interior is filled with graphite felt.

This growth apparatus is set so that temperature distribution in the crystal satisfies Gc<Ge when the monocrystal pulled up from the melt is within a temperature range from the melting point to 1250° C.

High-purity silicon polycrystal was inserted into a crucible 1, a reduced-pressure atmosphere was created inside the apparatus, and the silicon was melted by heating with a heater 2 to obtain a melt 3. Seed crystal attached to a seed chuck 5 was immersed in the melt 3, and pull-up was conducted while rotating the crucible 1 and a pull-up shaft 4. After conducting seed contraction in order to obtain dislocation-free crystal, the shoulder portion was formed, and—transitioning from the shoulder—the body portion was formed.

Using a growth apparatus having the hot zone structure shown in FIG. 2, the target diameter Dc of the body portion is set at 200 mm. With the axial temperature gradient of the monocrystal interior during growth within a range from the melting point to 1370° C., the central portion was set to 3.0-3.2° C./mm and the peripheral portion to 2.3-2.5° C./mm, and the monocrystal was grown by having pull-up speed undergo a change of 0.6 mm/min→0.3 mm/min→0.6 mm/min. Oxygen concentration was 11.4-12.6×10$^{17}$ atoms/cc (old ASTM).

Figure 3:
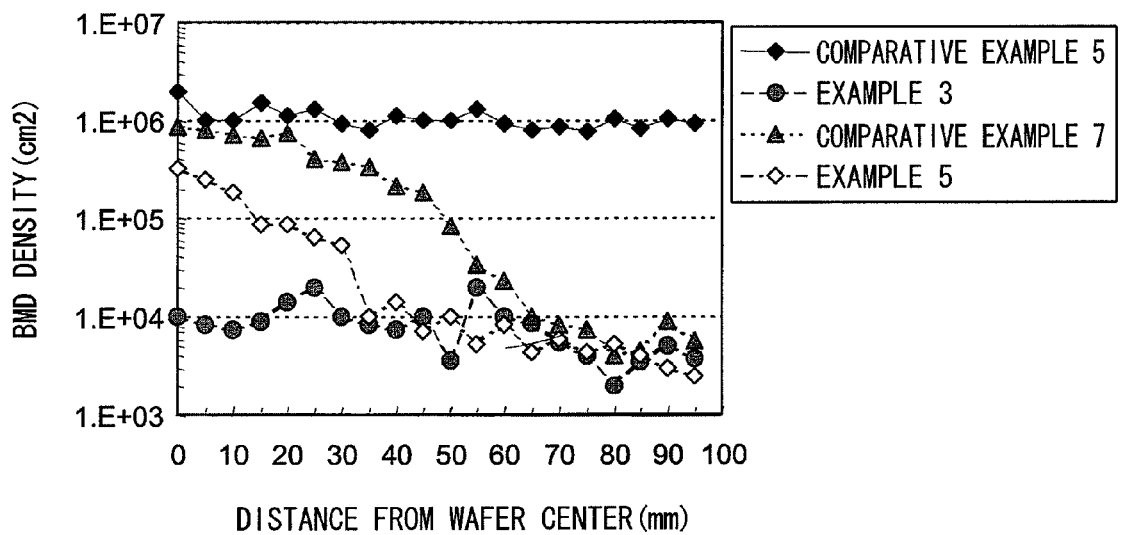
FIG. 3 is a graph which shows the density distribution of bulk micro defects of examples 3 and 5 and comparative examples 5 and 7.

The obtained monocrystal was sliced, and the wafer excised from the area grown as the interstitial-silicon-dominant defect-free region was used as the wafer of example 3. To determine whether a wafer excised from the monocrystal was from an interstitial-silicon-dominant defect-free region or a vacancy-dominant defect-free region, the wafer was subjected to heat treatment of 800° C.×4 hours and 1000° C.×16 hours in a dry oxygen atmosphere, 2 μm of light etching was conducted after cleaving the wafer, and the density of the oxygen precipitate was measured. A region where oxygen precipitate density of 5×10$^4$/cm$^2$ or less was observed was considered as an interstitial-silicon-dominant defect-free region, and a region where bulk micro defect density in excess of 5×10$^4$/cm$^2$ was observed was considered as a vacancy-dominant defect-free region. The density distribution of bulk micro defects (BM) in the radial direction of the wafer is shown by the O marks in FIG. 3, and it was confirmed that the wafer of example 3 was an interstitial-silicon-dominant defect-free wafer with an oxygen precipitate density of approximately 1×10$^4$/cm$^2$ across the entire surface in the radial direction.

Moreover, the defect-free properties in the depthwise direction of the wafer of example 3 was evaluated by the 90° light scattering method using MO-441 manufactured by Mitsui Kinzoku Co. Ltd. This measurement of light scattering defects (light scattering bodies) by the 90° light scattering method was conducted by the incidence of light of 1.06 μm (near infrared) wavelength of 1 W output from the surface side of the silicon wafer, and the detection of 90° scattered light detected from the cleaved surface of the wafer. The 90° scattered light was attenuated by insertion of a filter.

Figure 4:
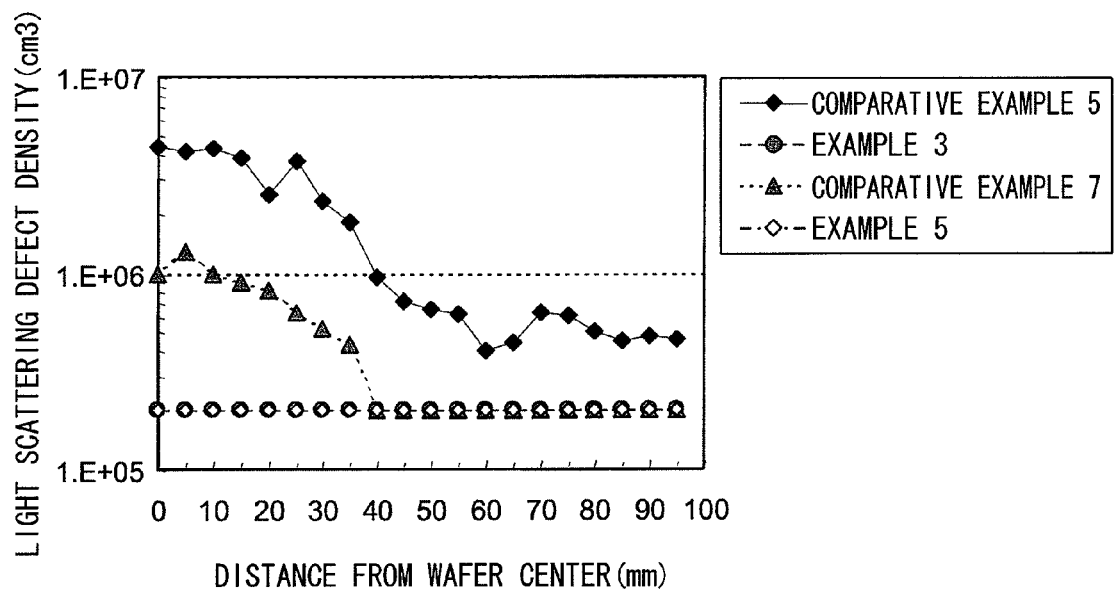
FIG. 4 is a graph which shows the density distribution of light scattering defects of examples 3 and 5 and comparative examples 5 and 7.

As it is difficult with this measurement method to measure light scattering defects in the region at 50 μm from the wafer surface due to the scattering of incident light by the cleaved surface, measurement was conducted at 20 points in the radial direction of the wafer with 5 mm in the diametric direction of the wafer constituting 1 view field in the region at a depth of 50 μm to 310 μm from the wafer surface. These measurement results are shown by the O marks in FIG. 4, and it was confirmed that the wafer of example 3 was a defect-free wafer with a light scattering defect density of approximately 2×10$^5$/cm$^3$ or less in the region at a depth of 50-310 μm across the entire surface in the radial direction.

Next, this silicon wafer of example 3 was repeatedly subjected 3 times to the rapid-temperature-increase/decrease heat treatment conducted in device manufacturing processes under conditions of a maximum temperature of 1100° C. and a rate of temperature increase of 300° C./sec. It was subsequently observed by X-ray topography observation whether there existed slip dislocations with movement toward the wafer surface, but the occurrence of slip dislocations was not observed.

EXAMPLE 4

A silicon wafer identical to that of example 3 was repeatedly subjected 3 times to the rapid-temperature-increase/decrease heat treatment conducted in device manufacturing processes under conditions of a maximum temperature of 1150° C. and a rate of temperature increase of 300° C./sec. It was subsequently observed by X-ray topography observation whether there existed slip dislocations with movement toward the wafer surface, but the occurrence of slip dislocations was not observed.

EXAMPLE 5

The monocrystal obtained in example 3 was sliced, and a wafer excised from a location where a vacancy-dominant defect-free region and an interstitial-silicon-dominant defect-free region intermixed was used as the wafer of example 5.

With respect to determining the mixing ratio of the vacancy-dominant defect-free region and interstitial-silicon-dominant defect-free region, the wafer was subjected to heat treatment of 800° C.×4 hours and 1000° C.×16 hours in a dry oxygen atmosphere, 2 μm of light etching was conducted after cleaving the wafer, and the density of the bulk micro defect was measured. A region where bulk micro defect density of $5\times10^4/cm^2$ or less was observed was considered as an interstitial-silicon-dominant defect-free region, and a region where bulk micro defect density in excess of $5\times10^4/cm^2$ was observed was considered as a vacancy-dominant defect-free region. The density distribution of bulk micro defects (BMD) in the radial direction of the wafer is shown by the ◇ marks in FIG. 3, and it was confirmed that the wafer of example 5 was a wafer which had a vacancy-dominant defect-free region from the wafer center to 30 mm and which, outside of this, had an interstitial-silicon-dominant defect-free region with an oxygen precipitate density of approximately $1\times10^4/cm^2$.

Defect-free properties in the depthwise direction of the wafer of example 5 was evaluated by the 90° light scattering method using MO-441 manufactured by Mitsui Kinzoku Co. Ltd. in the same manner as example 3. These measurement results are shown by the ◇ marks in FIG. 4, and it was confirmed that the wafer of example 5 was a defect-free wafer with a light scattering defect density of approximately $2\times10^5/cm^3$ or less in the region at a depth of 50-310 μm across the entire surface in the radial direction.

Next, this silicon wafer of example 5 was repeatedly subjected 3 times to the rapid-temperature-increase/decrease heat treatment conducted in device manufacturing processes under conditions of a maximum temperature of 1100° C. and a rate of temperature increase of 300° C./sec. It was subsequently observed by X-ray topography observation whether there existed slip dislocations with movement toward the wafer surface, but the occurrence of slip dislocations was not observed.

EXAMPLE 6

A silicon wafer identical to that of example 5 was repeatedly subjected 3 times to the rapid-temperature-increase/decrease heat treatment conducted in device manufacturing processes under conditions of a maximum temperature of 1150° C. and a rate of temperature increase of 300° C./sec. It was subsequently observed by X-ray topography observation whether there existed slip dislocations with movement toward the wafer surface, but the occurrence of slip dislocations was not observed.

Example 8

A silicon wafer identical to that of example 3 and example 5 was repeatedly subjected 3 times to the rapid-temperature-increase/decrease heat treatment (flash-lamp annealing) conducted in device manufacturing processes under conditions of a maximum temperature of 1200° C. and a rate of temperature increase of 250000° C./sec. It was subsequently observed by X-ray topography observation whether there existed slip dislocations with movement toward the wafer surface, but the occurrence of slip dislocations was not observed.

COMPARATIVE EXAMPLE 5

As a comparative example of examples 3 and 5, the monocrystal obtained in example 3 was sliced, and a wafer excised from a location grown as a vacancy-dominant defect-free region was used as the wafer of comparative example 5.

To make the determination of a vacancy-dominant defect-free region or an interstitial-silicon-dominant defect-free region, the wafer was subjected to heat treatment of 800° C.×4 hours and 1000° C.×16 hours in a dry oxygen atmosphere, 2 μm of light etching was conducted after cleaving the wafer, and the density of the bulk micro defect was measured. A region where bulk micro defect density of $5\times10^4/cm^2$ or less was observed was considered as an interstitial-silicon-dominant defect-free region, and a region where oxygen precipitate density in excess of $5\times10^4/cm^2$ was observed was considered as a vacancy-dominant defect-free region. The density distribution of bulk micro defects (BMD) in the radial direction of the wafer is shown by the ♦ marks in FIG. 3, and it was confirmed that the wafer of comparative example 5 was a vacancy-dominant defect-free wafer with an oxygen precipitate density of approximately $1\times10^6/cm^2$ across the entire surface in the radial direction.

Moreover, the defect-free properties in the depthwise direction of the wafer of comparative example 5 was evaluated by the 90° light scattering method using MO-441 manufactured by Mitsui Kinzoku Co. Ltd. in the same manner as example 3. These measurement results are shown by the ♦ marks in FIG. 4, and it was confirmed that the wafer of comparative example 5 was a wafer with a light scattering defect density of approximately $4\times10^5/cm^3$ or more in the region at a depth of 50-310 μm across the entire surface in the radial direction.

Next, this silicon wafer of comparative example 5 was repeatedly subjected 3 times to the rapid-temperature-increase/decrease heat treatment conducted in device manufacturing processes under conditions of a maximum temperature of 1100° C. and a rate of temperature increase of 300° C./sec. When it was subsequently observed by X-ray topography observation whether there existed slip dislocations with movement toward the wafer surface, the occurrence of slip dislocations was observed.

COMPARATIVE EXAMPLE 6

As a comparative example of examples 4 and 6, a silicon wafer identical to comparative example 5 was repeatedly subjected 3 times to the rapid-temperature-increase/decrease heat treatment conducted in device manufacturing processes under conditions of a maximum temperature of 1150° C. and a rate of temperature increase of 300° C./sec. When it was subsequently observed by X-ray topography observation whether there existed slip dislocations with movement toward the wafer surface, the occurrence of slip dislocations was observed.

COMPARATIVE EXAMPLE 7

As a comparative example of examples 3 and 5, the monocrystal obtained in example 3 was sliced, and a wafer excised from a location where a vacancy-dominant defect-free region and an interstitial-silicon-dominant defect-free region intermixed was used as the wafer of comparative example 7.

With respect to determining the mixing ratio of the vacancy-dominant defect-free region and interstitial-silicon-dominant defect-free region, the wafer was subjected to heat treatment of 800° C.×4 hours and 1000° C.×16 hours in a dry oxygen atmosphere, 2 μm of light etching was conducted after cleaving the wafer, and the density of the bulk micro defect was measured. A region where bulk micro defect density of $5\times10^4/cm^2$ or less was observed was considered as an interstitial-silicon-dominant defect-free region, and a region where bulk micro defect density in excess of $5\times10^4/cm^2$ was observed was considered as a vacancy-dominant defect-free region. The density distribution of bulk micro defects (BMD) in the radial direction of the wafer is shown by the Δ marks in FIG. 3, and it was confirmed that the wafer of comparative example 7 was a wafer which had a vacancy-dominant defect-free region from the wafer center to 60 mm and which, outside of this, had an interstitial-silicon-dominant defect-free region with an bulk micro defect density of approximately $1\times10^4/cm^2$.

Moreover, the defect-free properties in the depthwise direction of the wafer of comparative example 7 was evaluated by the 90° light scattering method using MO-441 manufactured by Mitsui Kinzoku Co. Ltd. in the same manner as example 3. These measurement results are shown by the Δ marks in FIG. 4, and it was observed that the wafer of comparative example 7 had a light scattering defect density of $2\times10^5/cm^3$ or more in the region from the wafer center until 35 mm.

Next, this silicon wafer of example 7 was repeatedly subjected 3 times to the rapid-temperature-increase/decrease heat treatment conducted in device manufacturing processes under conditions of a maximum temperature of 1100° C. and a rate of temperature increase of 300° C./sec. When it was subsequently observed by X-ray topography observation whether there existed slip dislocations with movement toward the wafer surface, the occurrence of slip dislocations was observed.

COMPARATIVE EXAMPLE 8

As a comparative example of examples 4 and 6, a silicon wafer identical to comparative example 7 was repeatedly subjected 3 times to the rapid-temperature-increase/decrease heat treatment conducted in device manufacturing processes under conditions of a maximum temperature of 1150° C. and a rate of temperature increase of 300° C./sec. When it was subsequently observed by X-ray topography observation whether there existed slip dislocations with movement toward the wafer surface, the occurrence of slip dislocations was observed.

REFERENCE EXAMPLE 5

As a reference example of examples 3 to 6 and comparative examples 5 to 8, the silicon wafer of example 3 was repeatedly subjected 3 times to the rapid-temperature-increase/decrease heat treatment conducted in device manufacturing processes under conditions of a maximum temperature of 1075° C. and a rate of temperature increase of 300° C./sec. It was subsequently observed by X-ray topography observation whether there existed slip dislocations with movement toward the wafer surface, but the occurrence of slip dislocations was not observed.

REFERENCE EXAMPLE 6

As a reference example of examples 3 to 6 and comparative examples 5 to 8, the silicon wafer of example 5 was repeatedly subjected 3 times to the rapid-temperature-increase/decrease heat treatment conducted in device manufacturing processes under conditions of a maximum temperature of 1075° C. and a rate of temperature increase of 300° C./sec. It was subsequently observed by X-ray topography observation whether there existed slip dislocations with movement toward the wafer surface, but the occurrence of slip dislocations was not observed.

REFERENCE EXAMPLE 7

As a reference example of examples 3 to 6 and comparative examples 5 to 8, the silicon wafer of example 5 was repeatedly subjected 3 times to the rapid-temperature-increase/decrease heat treatment conducted in device manufacturing processes under conditions of a maximum temperature of 1100° C. and a rate of temperature increase of 2500° C./sec. It was subsequently observed by X-ray topography observation whether there existed slip dislocations with movement toward the wafer surface, but the occurrence of slip dislocations was not observed.

REFERENCE EXAMPLE 8

As a reference example of examples 3 to 6 and comparative examples 5 to 8, the silicon wafer of comparative example 5 was repeatedly subjected 3 times to the rapid-temperature-increase/decrease heat treatment conducted in device manufacturing processes under conditions of a maximum temperature of 1075° C. and a rate of temperature increase of 300° C./sec. It was subsequently observed by X-ray topography observation whether there existed slip dislocations with movement toward the wafer surface, but the occurrence of slip dislocations was not observed.

REFERENCE EXAMPLE 9

As a reference example of examples 3 to 6 and comparative examples 5 to 8, the silicon wafer of comparative example 5 was repeatedly subjected 3 times to the rapid-temperature-increase/decrease heat treatment conducted in device manufacturing processes under conditions of a maximum temperature of 1100° C. and a rate of temperature increase of 250° C./sec. It was subsequently observed by X-ray topography observation whether there existed slip dislocations with movement toward the wafer surface, but the occurrence of slip dislocations was not observed.

REFERENCE EXAMPLE 10

As a reference example of examples 3 to 6 and comparative examples 5 to 8, the silicon wafer of comparative example 7 was repeatedly subjected 3 times to the rapid-temperature-increase/decrease heat treatment conducted in device manufacturing processes under conditions of a maximum temperature of 1075° C. and a rate of temperature increase of 300° C./sec. It was subsequently observed by X-ray topography observation whether there existed slip dislocations with movement toward the wafer surface, but the occurrence of slip dislocations was not observed.

TABLE 2

| | Wafer properties Light scattering defect density (/cm3) at a depth of 50-310 μm | Rapid heat treatment conditions | | Evaluation results Slip dislocations |
| --- | --- | --- | --- | --- |
| | | Maximum temperature (° C.) | Rate of temperature increase (° C./sec) | |
| Example 3 | 2.0E+05 | 1100 | 300 | No |
| Example 4 | 2.0E+05 | 1150 | 300 | No |

TABLE 2-continued

|  | Wafer properties Light scattering defect density (/cm3) at a depth of 50-310 μm | Rapid heat treatment conditions | | Evaluation results Slip dislocations |
|---|---|---|---|---|
|  |  | Maximum temperature (° C.) | Rate of temperature increase (° C./sec) |  |
| Example 5 | 2.0E+05 | 1100 | 300 | No |
| Example 6 | 2.0E+05 | 1150 | 300 | No |
| Example 8 | 2.0E+05 | 1200 | 250000 | No |
| Comparative example 5 | 4.0E+05< | 1100 | 300 | Yes |
| Comparative example 6 | 4.0E+05< | 1150 | 300 | Yes |
| Comparative example 7 | 2.0E+05< | 1100 | 300 | Yes |
| Comparative example 8 | 2.0E+05< | 1150 | 300 | Yes |
| Reference example 5 | 1.9E+09 | 1075 | 300 | No |
| Reference example 6 | 2.0E+05 | 1075 | 300 | No |
| Reference example 7 | 2.0E+05 | 1100 | 250 | No |
| Reference example 8 | 4.0E+05< | 1075 | 300 | No |
| Reference example 9 | 4.0E+05< | 1100 | 250 | No |
| Reference example 10 | 2.0E+05< | 1075 | 300 | No |

<<Consideration>>

From the results of comparative examples 5-8 and reference examples 5-10, it was confirmed that when the conditions of the rapid-temperature-increase/decrease heat treatment conducted in device manufacturing processes are not those of a maximum temperature of 1100° C. or more and a rate of temperature increase of 300° C./sec or more, slip dislocations do not occur according to X-ray topography observation.

From the results of examples 3-6, 8 and comparative examples 5-8 which are based thereon, it was confirmed that if a layer which has light scattering defect density of $2 \times 10^5/\text{cm}^3$ or less according to the 90° light scattering method is formed in a region at a depth from the wafer surface of 50 μm or more, slip dislocations do not occur even when rapid-temperature-increase/decrease heat treatment is conducted under the aforementioned conditions of a maximum temperature of 1100° C. or more and a rate of temperature increase of 300° C./sec or more.

While preferred examples of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A silicon wafer used in a semiconductor device manufacturing process which conducts heat treatment under conditions of a maximum temperature of 1100° C. or more and a rate of temperature increase of 300° C./sec or more after subjecting the silicon wafer to mirror machining,
wherein, after slicing from a silicon monocrystal ingot, heat treatment is conducted so that a layer which has zero light scattering defects according to the 90° light scattering method is formed in a region at a depth from the wafer surface of 25 μm or more but less than 100 μm, and a layer which has a light scattering defect density of $1 \times 10^8/\text{cm}^3$ or more according to the 90° light scattering method is formed in a region at a depth of 100 μm from the wafer surface.

2. A manufacturing method for silicon wafers used in a semiconductor device manufacturing process which conducts heat treatment under conditions of a maximum temperature of 1100° C. or more and a rate of temperature increase of 300° C./sec or more after subjecting the silicon wafer to mirror machining,
wherein, after slicing from a silicon monocrystal ingot, heat treatment is conducted so that a layer which has zero light scattering defects according to the 90° light scattering method is formed in a region at a depth from the wafer surface of 25 μm or more but less than 100 μm, and a layer which has a light scattering defect density of $1 \times 10^8/\text{cm}^3$ or more according to the 90° light scattering method is formed in a region at a depth of 100 μm from the wafer surface.

3. A silicon wafer sliced from a silicon monocrystal ingot grown by the Czochralski method so as to be free of grown-in defects in the body portion, which is a silicon wafer used in a semiconductor device manufacturing process which conducts heat treatment under conditions of a maximum temperature of 1100° C. or more and a rate of temperature increase of 300° C./sec or more after subjecting the silicon wafer to mirror machining,
wherein a layer which has a light scattering defect density of $2 \times 10^5/\text{cm}^3$ or less according to the 90° light scattering method is formed in a region at a depth of 50 μm or more from the wafer surface.

4. A manufacturing method for silicon wafers used in a semiconductor device manufacturing process which conducts heat treatment under conditions of a maximum temperature of 1100° C. or more and a rate of temperature increase of 300° C./sec or more after subjecting the silicon wafer to mirror machining,
wherein said manufacturing method for silicon wafers has a process which conducts slicing from a silicon monocrystal ingot grown by the Czochralski method so as to be free of grown-in defects in the body portion,
and wherein a layer which has a light scattering defect density of $2 \times 10^5/\text{cm}^3$ or less according to the 90° light scattering method is formed in a region at a depth of 50 μm or more from the wafer surface.

* * * * *